(12) United States Patent
Cho et al.

(10) Patent No.: US 10,777,631 B2
(45) Date of Patent: Sep. 15, 2020

(54) DISPLAY DEVICE

(71) Applicant: SAMSUNG DISPLAY CO., LTD., Yongin-si, Gyeonggi-do (KR)

(72) Inventors: Seung-Hwan Cho, Yongin-si (KR); Jong Hyun Choi, Seoul (KR); Doo Hwan Kim, Yongin-si (KR); Do Keun Song, Yongin-si (KR); Joo Sun Yoon, Seoul (KR); Min Jae Jeong, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 16/201,172

(22) Filed: Nov. 27, 2018

(65) Prior Publication Data

US 2019/0165079 A1    May 30, 2019

(30) Foreign Application Priority Data

Nov. 28, 2017   (KR) .................. 10-2017-0160327

(51) Int. Cl.
    *H01L 27/32* (2006.01)
    *H01L 51/52* (2006.01)
    *H01L 27/12* (2006.01)

(52) U.S. Cl.
    CPC ...... *H01L 27/3276* (2013.01); *H01L 27/3258* (2013.01); *H01L 27/3262* (2013.01); *H01L 51/5246* (2013.01); *H01L 27/1214* (2013.01)

(58) Field of Classification Search
    CPC ............ H01L 27/3276; H01L 27/3258; H01L 27/3262; H01L 27/1214
    See application file for complete search history.

(56) References Cited

U.S. PATENT DOCUMENTS

| | | | |
|---|---|---|---|
| 7,753,751 B2 * | 7/2010 | Yamazaki | ........... H01L 27/3246 445/24 |
| 10,083,992 B2 * | 9/2018 | Go | ...................... H01L 27/3246 |

(Continued)

FOREIGN PATENT DOCUMENTS

| | | |
|---|---|---|
| KR | 10-2012-0017928 | 2/2012 |
| KR | 10-2015-0049141 | 5/2015 |

(Continued)

*Primary Examiner* — Nathan W Ha
(74) *Attorney, Agent, or Firm* — F. Chau & Associates (57) ABSTRACT

A display device includes: a first substrate including a display area and a non-display area bordering at least a portion of the display area; a first transistor disposed in the display area, and includes a semiconductor layer, a gate electrode, a source electrode, and a drain electrode. A driving circuit is disposed in the non-display area, and includes a second transistor including a semiconductor layer, a gate electrode, a source electrode, and a drain electrode. An insulating layer disposed between the source and drain electrodes of the second transistor and the source and drain electrodes of the first transistor over the second transistor; a signal transmission line disposed in the non-display area, and transmitting a signal to the driving circuit; a second substrate facing the first substrate; and a sealant disposed in the non-display area between the first substrate and the second substrate, and overlapping the second transistor. The structure of the display device provides a bezel with a reduced width and resistance to pixel damage during formation of the sealant.

18 Claims, 9 Drawing Sheets

(56) References Cited

U.S. PATENT DOCUMENTS

| | | | | |
|---|---|---|---|---|
| 2002/0104995 | A1* | 8/2002 | Yamazaki | H01L 27/3246 257/72 |
| 2005/0046346 | A1* | 3/2005 | Tsuchiya | H01L 27/3244 313/509 |
| 2006/0255345 | A1* | 11/2006 | Sakakura | G02F 1/136286 257/88 |
| 2015/0236297 | A1* | 8/2015 | Hong | H01L 51/5246 257/40 |
| 2016/0079333 | A1* | 3/2016 | Shishido | G09G 3/3659 257/72 |
| 2016/0293883 | A1* | 10/2016 | Hong | H01L 51/5246 |
| 2017/0069696 | A1* | 3/2017 | Kondo | H01L 27/3276 |
| 2017/0271617 | A1* | 9/2017 | Choi | H01L 27/3244 |
| 2019/0379002 | A1* | 12/2019 | Abe | H01L 51/5221 |
| 2019/0393288 | A1* | 12/2019 | Yamazaki | H01L 51/56 |

FOREIGN PATENT DOCUMENTS

| | | |
|---|---|---|
| KR | 10-2016-0032798 | 3/2016 |
| KR | 10-2016-0046072 | 4/2016 |

\* cited by examiner

DISPLAY DEVICE

CROSS-REFERENCE TO RELATED APPLICATIONS

This application claims priority from and the benefit of Korean Patent Application No. 10-2017-0160327 filed in the Korean Intellectual Property Office on Nov. 28, 2017, the entire contents of which are incorporated by reference herein.

1. TECHNICAL FIELD

Embodiments of the inventive concept relates to a display device. More particularly, embodiments of the inventive concept relate to construction of an organic light emitting device having a reduced bezel width.

2. DISCUSSION OF THE RELATED ART

Display devices such as an organic light emitting device or a liquid crystal display are now in widespread use. Such display devices include a display panel including pixels displaying images. On the display panel, driving circuits, and pads for inputting signals that control the pixels and the driving circuits are formed on the display panel. In addition, the pixels, and signal lines that transmit signals connected to the pads may also be formed on the display panel.

Elements configuring the display panel of the organic light emitting device, particularly, organic mission layers and electrodes, are susceptible to damage caused by moisture and oxygen. Accordingly, the display panel is typically sealed so that the moisture and oxygen may not permeate into it. In a conventional sealing method with some degree of air-tightness, a skill for disposing a frit between an element substrate on which organic light emitting diodes is formed and an encapsulation substrate, and irradiating laser beams to the frit to melt the element substrate and the encapsulation substrate and bond them by a cured frit (or a seal), is in use.

User demands for a display device with a reduced bezel width have increased as such display devices have become more popular. However, as the bezel width of such display panels is reduced, the heat applied during the sealing process may influence the driving circuit and/or elements of the display device such as discussed above.

The information disclosed herein above is provide only to enhance understanding of the related art that was discussed and therefore it may contain information that does not form the prior art that is already known in this country to a person of ordinary skill in the art.

SUMMARY

Embodiments of the inventive concept provide a display device for reducing a width of a bezel.

An exemplary embodiment of the inventive concept provides a display device including: a first substrate including a display area and a non-display area; a first transistor disposed in the display area, and including a semiconductor layer, a gate electrode, a source electrode, and a drain electrode; a driving circuit disposed in the non-display area, and including a second transistor including a semiconductor layer, a gate electrode, a source electrode, and a drain electrode; a first insulating layer disposed between the source and drain electrodes of the second transistor and the source and drain electrodes of the first transistor over the second transistor; a signal transmission line disposed in the non-display area, and transmitting a signal to the driving circuit; a second substrate facing the first substrate; and a sealant disposed in the non-display area between the first substrate and the second substrate, and overlapping the second transistor.

The signal transmission line may be connected to the second transistor through a contact hole formed in the insulating layer.

The source electrode and the drain electrode of the first transistor may be connected to the semiconductor layer of the first transistor through contact holes formed in the insulating layer.

According to an embodiment of the inventive concept, the display device may further include a common voltage transmission line disposed between the second transistor and the signal transmission line in the non-display area, wherein the common voltage transmission line overlaps the source electrode or the drain electrode of the second transistor.

According to an embodiment of the inventive concept, the source electrode and the drain electrode of the first transistor, the signal transmission line, and the common voltage transmission line may be disposed directly on the insulating layer.

The display device may further include a plurality of second insulating layers disposed between the gate electrode of the second transistor and the source and drain electrodes of the second transistor.

The source electrode and the drain electrode of the second transistor may be made of a metal with a melting point that is equal to or greater than 700° C., or a metal alloy thereof.

The metal may be molybdenum, and the metal alloy may be aluminum-neodymium or a titanium nitride.

According to an embodiment of the inventive concept, the display device may further include a common voltage transmission line disposed between the sealant and the display area in the non-display area, wherein the common voltage transmission line may not be disposed between the driving circuit and the display area (e.g. arranged other than between the driving circuit and the display area).

The common voltage transmission line may include a first common voltage transmission line and a second common voltage transmission line facing each other with the display area therebetween, and the first common voltage transmission line may be electrically connected to the second common voltage transmission line by a plurality of connection lines traversing the display area.

The light-emitting element may include, for example, a pixel electrode, a common electrode, and an emission layer disposed between the pixel electrode and the common electrode, and the common electrode may be electrically connected to the common voltage transmission line.

According to an embodiment of the inventive concept, an organic insulating layer may not be disposed between the second transistor and the sealant.

According to an embodiment of the inventive concept, the non-display area is arranged along at least portion of a periphery of the display area, and the driving circuit includes a first driving circuit and a second driving circuit arranged at least at one of a left side or a right side of the non-display area, and wherein the sealant overlaps the first driving circuit and the second driving circuit.

Another embodiment of the inventive concept provides a display device including: a first substrate including a display area and a non-display area; a light-emitting element disposed in the display area, and including a pixel electrode, a common electrode, and an emission layer; a driving circuit provided in the non-display area, and generating and outputting a driving signal for the light-emitting element; a second substrate facing the first substrate; a sealant disposed in the non-display area between the first substrate and the second substrate, and overlapping at least part of the driving circuit; and a common voltage transmission line electrically connected to the common electrode, disposed between the sealant and the display area, and not disposed between the driving circuit and the display area.

According to an embodiment of the inventive concept, the common voltage transmission line may include a first common voltage transmission line and a second common voltage transmission line facing each other with the display area therebetween, and the first common voltage transmission line may be electrically connected to the second common voltage transmission line by a plurality of connection lines traversing the display area.

According to an embodiment of the inventive concept, the driving circuit may include a first driving circuit and a second driving circuit facing each other with the display area therebetween in a direction that is different from a direction in which the first common voltage transmission line faces the second common voltage transmission line.

According to an embodiment of the inventive concept, the driving circuit may include a transistor overlapping the sealant, and the source electrode and the drain electrode of the transistor may be formed of a metal with a melting point that is equal to or greater than 700° C., or a metal alloy thereof.

The metal may be molybdenum, and the metal alloy may be aluminum-neodymium or a titanium nitride.

The display device may further include a signal transmission line for transmitting a signal to the driving circuit, wherein the signal transmission line may be formed of a same material as the source electrode and the drain electrode of the transistor.

The sealant may overlap the signal transmission line.

According to an embodiment of the inventive concept, the source electrode and the drain electrode of the transistor may contact the sealant.

According to an embodiment of the inventive concept, the source and drain electrodes of the transistor are formed with a metal or metal alloy having a melting point that is higher than the temperature applied in forming of the sealant to overlap the driving circuit.

According to the exemplary embodiments of the inventive concept, the width of the non-display area of the display panel may be reduced without imparting damage to the driving circuit by heat generated in a sealing process, thereby facilitating a reduction in the width of the bezel of the display device.

DETAILED DESCRIPTION OF THE EMBODIMENTS

Embodiments of the inventive concept will be described more fully hereinafter with reference to the accompanying drawings. As those skilled in the art would realize, the described embodiments of the inventive concept may be modified in various different ways, all without departing from the spirit or scope of same.

The description of the exemplary embodiments of the inventive concept may omit a description of unrelated or known structures and functions that may otherwise obscure an artisan's appreciation of the embodiments of the inventive concept. In addition, like reference numerals designate like elements throughout the specification.

The size and thickness of each component shown in the drawings may be arbitrarily shown for better understanding and ease of description, but the embodiments of the inventive concept are not limited thereto. In the drawings, the thickness of layers, films, panels, regions, etc., are exaggerated for clarity. For better understanding and ease of description, the thickness of some layers and areas is exaggerated.

It will be understood that when an element such as a layer, film, region, or substrate is referred to as being "on" another element, it may be arranged directly on the other element, or intervening elements may also be present. In contrast, when an element is referred to as being arranged "directly on" another element, there are no intervening elements present.

Unless explicitly described to the contrary, the word "comprise" and variations such as "comprises", "comprised of", or "comprising" will be understood to imply the inclusion of stated elements but not the exclusion of any other elements.

The phrase "on a plane" should be understood as viewing the object portion from the top, and the phrase "on a cross-section" should be understood as viewing a cross-section of which the object portion is vertically cut from the side.

A display device according to an exemplary embodiment of the inventive concept will now be described with reference to accompanying drawings. A display panel of an organic light emitting device will be exemplified, but the display device according to the embodiments of the inventive concept will not be limited thereto.

Figure 1:
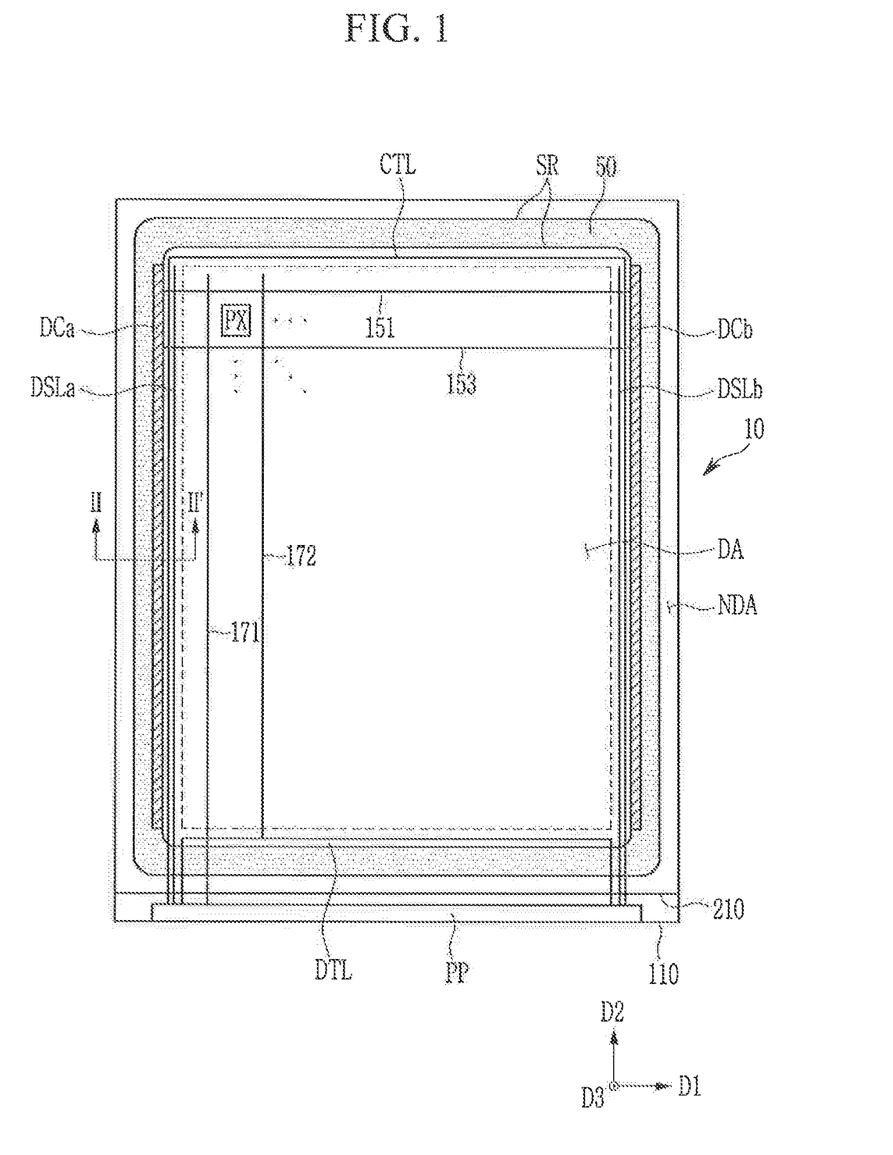
FIG. 1 shows a layout view of a display panel according to an exemplary embodiment of the inventive concept.
Figure 2:
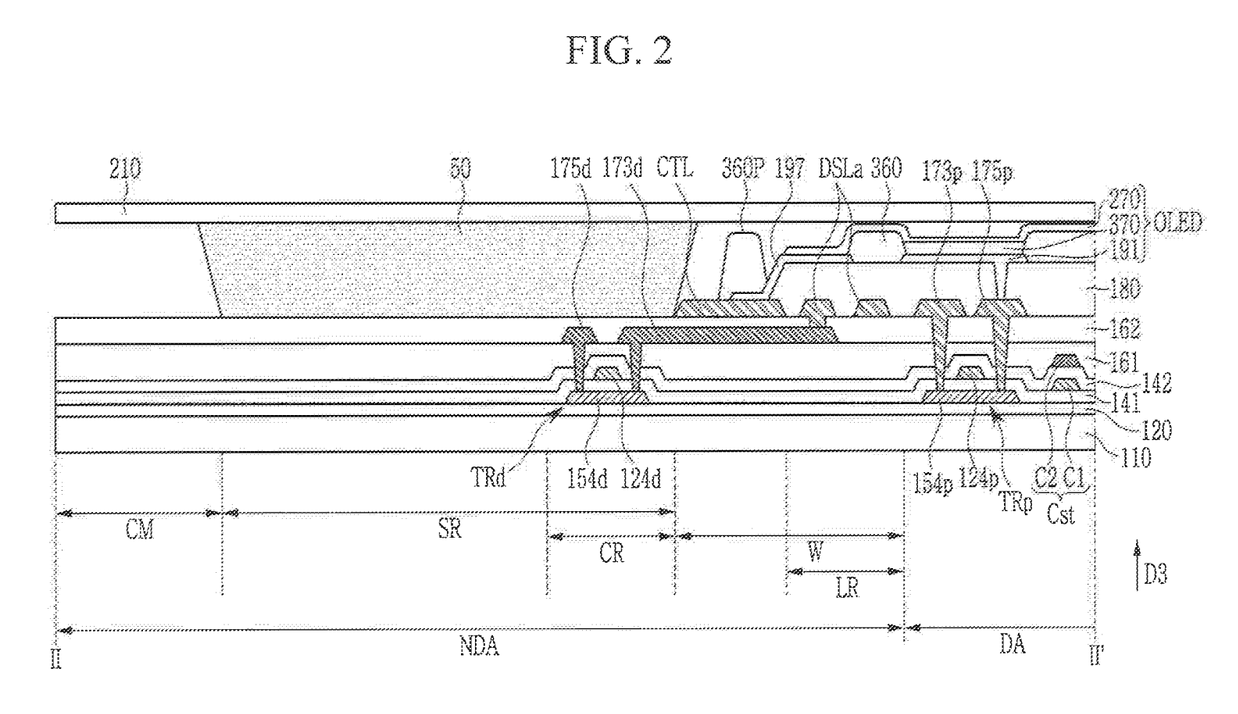
FIG. 2 and FIG. 3 respectively show a cross-sectional view of an example with respect to a line II-II' of FIG. 1.
Figure 3:
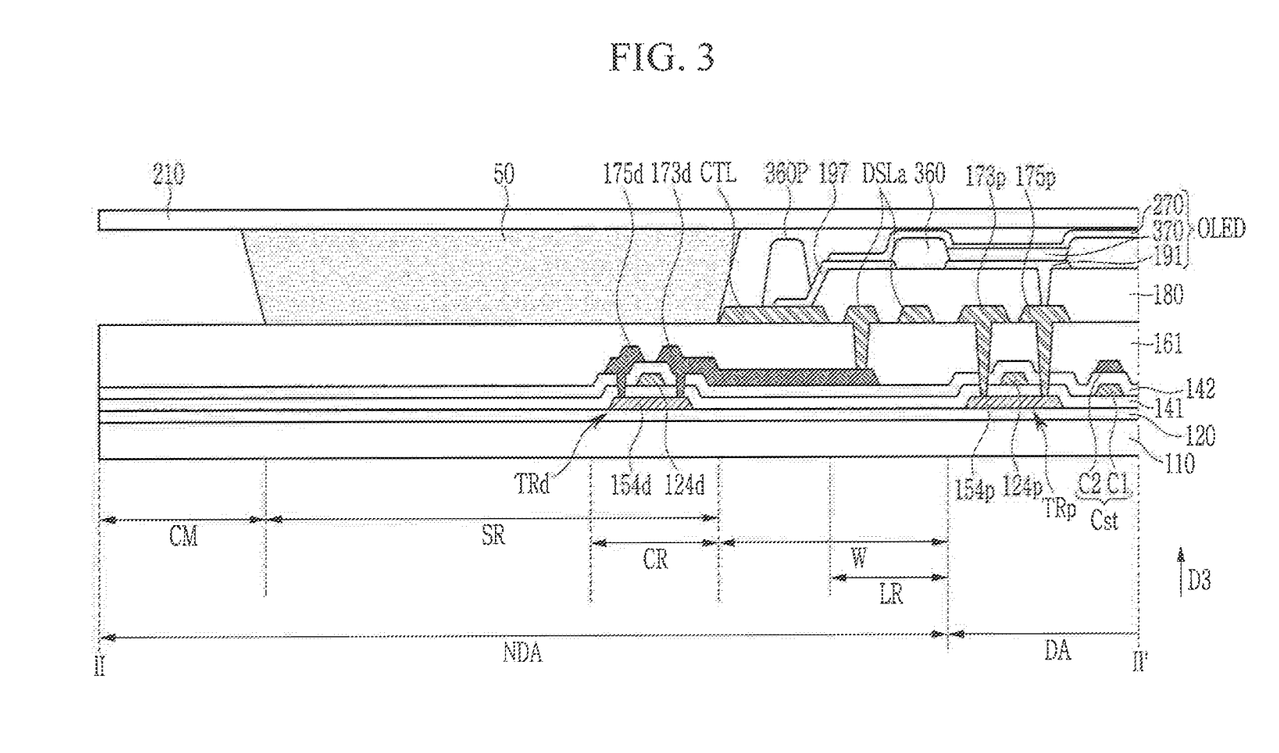

FIG. 1 shows a layout view of a display panel according to an exemplary embodiment of the inventive concept, and FIG. 2 and FIG. 3 respectively show a cross-sectional view of an example with respect to a line II-II' of FIG. 1.

Referring to FIG. 1, the display panel 10 includes a display area (DA) (also referred to as an active area) for displaying an image, and a non-display area (NDA) (also referred to as a peripheral area) which is provided near (e.g., adjacent, along at least part of a periphery of) the display area (DA) and in which elements and/or wires for generating and/or transmitting various signals applied to the display area (DA) are disposed. In FIG. 1, with respect to a border line of a quadrangle shown with dotted lines, a region inside the border line corresponds to the display area (DA) and a region outside it corresponds to the non-display area (NDA).

Pixels (PX) may be, for example, arranged as a matrix on a first substrate 110 in the display area (DA). Signal lines such as scan lines (also referred to as gate lines) 151, emission control lines 153, data lines 171, and driving voltage lines 172 are disposed on the first substrate 110 in the display area (DA). The scan lines 151 and the emission control lines 132 may extend in a first direction D1, and the data lines 171 and the driving voltage lines 172 may extend in a second direction D2 crossing the first direction D1. Each pixel PX may be connected to a scan line 121, an emission control line 153, a data line 171, and a driving voltage line 172, and it may receive a scan signal (also referred to as a gate signal), an emission control signal, a data signal, and a driving voltage (ELVDD) from the signal lines.

A touch (contact) electrode (not shown) for sensing a contact or a non-contact touch (e.g., near-contact touch with a certain predetermined distance from the display) of a user may be disposed in the display area (DA). The contact (or near-contact) sensed may also be made with a stylus or a digital pen. The touch electrode may be, for example, provided on a second substrate 210, and a person of ordinary skill in the art should understand and appreciate that embodiments of the inventive concept are not limited to the arrangement of the touch electrode on the second substrate 210.

A pad portion (PP) including pads (not shown) for receiving signals from outside of the display panel 10 is provided on the first substrate 110 in the non-display area (NDA). The pad portion (PP) may, as shown in FIG. 1, be provided on a lower end portion of the display panel 10, and it is not limited thereto. The pads of the pad portion (PP) are electrically connected to wires disposed in the non-display area (NDA). The pad portion (PP) may be bonded to a flexible printed circuit film (not shown) for transmitting external signals and voltages. In an embodiment of the inventive concept, three edges (including an upper edge, a left edge, and a right edge) of the first substrate 110 may correspond to three edges of the second substrate 210, and the first substrate 110 may be formed to be longer than the second substrate 210 in the region where the pad portion (PP) is provided so that the pad portion (PP) may be exposed for bonding of the flexible printed circuit film.

A driving device for generating and/or processing various signals for driving the pixels (PX) of the display area (DA) may be provided in the display area (NDA). In addition, the driving device may be provided on the flexible printed circuit film bonded to the pad portion (PP). The driving device may include a data driver for applying data signals to the data lines 171, a scan driver for applying scan signals to the scan lines 151, an emission driver for applying emission control signals to the emission control lines 153, and a signal controller for controlling the data driver, the scan driver, and the emission driver.

The scan driver and the emission driver may be integrated as first and second driving circuits (DCa, DCb) in the non-display area (NDA) of the display panel 10. The driving circuits (DCa, DCb) may include a driving circuit (DCa) provided on, for example, a left side of the display area (DA) and a driving circuit (DCb) provided on, for example, a right side of the display area (DA), and they may extend in the second direction D2. Each of the driving circuits (DCa, DCb) may include a scan driver and/or an emission driver. Differing from the drawing, for example, both of the driving circuits (DCa, DCb) may be provided on one side of the display area (DA). The driving circuits (DCa, DCb) may be electrically connected to the scan lines 151 and the emission control lines 153. The driving circuits (DCa, DCb) may include a shift register including stages dependently connected to each other, and the stages may respectively include a plurality of transistors and at least one capacitor. Each stage may receive driving circuit signals to generate a gate signal and/or an emission control signal and output the same.

The data driver and the signal controller may be provided as part of an integrated circuit chip. The integrated circuit chip may be electrically connected to the display panel 10 as a tape carrier package (TCP), or the integrated chip circuit may be mounted on the display panel 10. The data driver and the signal controller may be formed as a single chip, or separate chips.

Driving signal lines (DSLa, DSLb) are provided in the non-display area (NDA) for transmitting driving circuit signals for operating driving circuits (DCa, DCb) to the driving circuits (DCa, DCb). The driving signal lines (DSLa, DSLb) may include driving signal lines (DSLa) provided on the left side of the display area (DA) and driving signal lines (DSLb) provided on the right side of the display area (DA). The driving signal lines (DSLa, DSLb) are shown as one line in FIG. 1 to avoid the drawing from being overly complex, but a person of ordinary skill in the art should appreciate that according to embodiments of the inventive concept, the driving signal lines (DSLa, DSLb) may include a number of signal lines corresponding to the number of signals applied to the driving circuits (DCa, DCb), and they may include a number of signal lines that is greater or lesser than the number of signals applied to the driving circuits. The driving signal lines (DSLa, DSLb) may be electrically connected to the pad portion (PP), and may extend in the second direction D2 in parallel to the driving circuits (DCa, DCb) between the driving circuits (DCa, DCb) and the display area (DA).

The driving circuit signals transmitted to the driving circuits (DCa, DCb) from the pad portion (PP) through the driving signal lines (DSLa, DSLb) may include, for example, scan clock signals, emission clock signals, a gate low voltage (VGL), a gate high voltage (VGH), a scan frame signal (also referred to as a start pulse vertical signal STV), and an emission frame signal. The scan dock signals, the gate low voltage (VGL), and the gate high voltage (VGH) may be transmitted to the scan driver of the driving circuits (DCa, DCb), and may be used to generate the scan signal. The emission clock signals, the gate low voltage (VGL), and the gate high voltage (VGH) may be transmitted to the emission driver of the driving circuits (DCa, DCb), and may be used to generate the emission control signal. In addition, the scan frame signal may be transmitted to the scan driver to instruct a start of one frame for inputting a scan signal to the display area (DA), and the emission frame signal may be transmitted to the emission driver to instruct a start of one frame for inputting an emission control signal to the display area (DA).

A common voltage transmission line (CTL) that supplies a common voltage (ELVSS) to pixels (PX) may be provided in the non-display area (NDA). The common voltage transmission line (CTL) may receive a common voltage (ELVSS) of a predetermined level through the pad portion (PP), and may transmit the same to the common electrode of the pixels (PX). The common voltage transmission line (CTL) may include a first end and a second end electrically connected to the pad portion (PP), and it may be formed to surround the display area (DA). The common voltage transmission line (CTL) may be provided between the driving circuits (DCA, DCb) and the driving signal lines (DSLa, DSLb) on the right and left sides of the display area (DA).

A driving voltage transmission line (DTL) that supplies a driving voltage (ELVDD) to the pixels (PX) may be provided in the non-display area (NDA). The driving voltage transmission line (DTL) may be electrically connected to the pad portion (PP) and the driving voltage line 172, and it may be provided on the lower side of the display area (DA). The driving voltage (ELVDD) input through the pad portion (PP) may be applied to the pixels (PX) through the driving voltage transmission line (DTL) and the driving voltage line 172.

The non-display area (NDA) includes a sealing region (SR). As shown in FIG. 2, for example, the sealing region (SR) is separated from the display area (DA). A sealant 50 provided between the first substrate 110, which is an element substrate, and the second substrate 210, and an encapsulation substrate is provided in the sealing region (SR). The sealant 50 is formed at a periphery of the display area to surround the display area (DA), and is formed to overlap the sealing region (SR) in a plane view. In this embodiment of the inventive concept, the sealant 50 may surround a perimeter of the entire display area The sealant 50 bonds the first substrate 110 and the second substrate 210, and it prevents impurities such as moisture or oxygen from permeating between the first substrate 110 and the second substrate 210 from the outside. Therefore, the display area (DA) may be sealed with air-tightness by the first substrate 110, the second substrate 210, and the sealant 50 provided therebetween.

The sealant 50 may at least partially overlap the driving circuits (DCa, DCb). When the sealant 50 overlaps the driving circuits (DCa, DCb) as described above, an area of the non-display area (DNA) provided on the right and left sides of the display area (DA) may be reduced, thereby reducing the width of the bezel of the display device. On the right and left sides of the display area (DA), the common voltage transmission line (CTL) and the driving signal lines (DSLa, DSLb) may be provided between the sealant 50 and the display area (DA). On the upper side of the display area (DA), the common voltage transmission line (CTL) may be provided between the sealant 50 and the display area (DA). The sealant 50 may at least partially overlap the common voltage transmission line (CTL), or may not overlap the common voltage transmission line (CTL).

The sealant 50, for example, may be formed by applying a sealing material to the second substrate 210, positioning the first substrate 110 so that the sealing material may be disposed between the first substrate 110 and the second substrate 210, and irradiating laser beams on a portion to which the sealing material is applied. In another example, according to an embodiment of the inventive concept, the sealant 50 may be formed by applying a sealing material to the first substrate 110 to position the second substrate 210, and irradiating laser beams to the portion of the first substrate to which the sealing material is applied. The applied sealing material may be a frit, and for example, a glass frit. When the laser beams irradiate the sealing material, the sealing material is heated so as to be melted, and adheres to the first substrate 110 and the second substrate 210 like an adhesive. The sealing material is cured while adhered to the first and second substrates. Thus, the sealant 50 may be applied in the aforementioned example to bond the first substrate 110 and the second substrate 210 with air-tightness. The laser beams may, for example, be irradiated on the second substrate 210, toward the sealing material. The heat applied to the sealing material by laser beams may be equal to or greater than about 300° C., and for example, it may be about 600° C. to about 660° C., and it may be locally higher than that range of temperature.

In an application of such a high-temperature process as discussed herein above, the driving circuits (DCa, DCb) overlap the sealant 50, there may be damage from the heat. For example, source and drain electrodes of transistors of the driving circuits (DCa, DCb) may be subject to being at least partially melted from the heat of the laser, and a junction with the semiconductor layer may be destroyed. Therefore, the driving circuits (DCa, DCb), particularly, the source and drain electrodes of the transistors, may be formed with a metal or metal alloy having a melting point that is higher than the temperature applied during the sealing process to melt the sealant, and for example, the melting point may be equal to or greater than about 700° C. Further, to prevent damage, in an embodiment of the inventive concept, an organic insulating layer may not be used in an area in which it is susceptible from damage by the heat of the laser. For example, an organic insulating layer that is weak at the high temperature provided by the laser to may not be provided in the sealing region (SR) (particularly, between the sealant 50 and substrate 110). The reason for not providing the organic insulating layer in the sealing region is because the organic insulating layer may output a gas that is burned at the high temperature, or the pixels (PX) may be degraded.

For example, the insulating layer disposed between the second transistor and the sealant to overlap the second transistor may be a non-organic insulating layer. Alternatively, there may not be an insulating layer in this area.

On the left, right, and upper edges of the display area (DA), the first substrate 110 and the second substrate 210 provided outside the sealing region (SR) then may be cut.

A stacked structure of the display panel 10 will now be described in detail with reference to FIG. 1 and FIG. 2. The pixel PX of the display area (DA) and the driving circuit (DCa) of the non-display area (NDA) may include a plurality of transistors, but transistors (TRp, TRd) will be described. For convenience, the transistor (TRp) of the pixel PX will be referred to as a first transistor, and the transistor (TRd) of the driving circuit (DCa) will be referred to as a second transistor. The first transistor (TRp) may be an emission control transistor or a driving transistor of the pixel PX, and the second transistor (TRd) may be an output transistor (also referred to as a buffer transistor) for outputting a scan signal or an emission control signal from a stage.

The first substrate 110 may be an insulation substrate comprised of glass, quartz, or ceramic. A buffer layer 120 may be provided on the first substrate 110. The buffer layer 120 may, while forming a semiconductor layer, intercept the impurity that may spread to the semiconductor layer from the first substrate 110, and it may reduce stress applied to the first substrate 110. The buffer layer 120 may increase the adhesiveness of the semiconductor layer. While the buffer layer 120 is an insulating layer, in this embodiment it will be referred to as a buffer layer in consideration of its function. The buffer layer 120 may include an inorganic insulating material such as a silicon oxide (SiOx) or a silicon nitride (SiNx).

A semiconductor layer 154*p* of the first transistor (TRp) and a semiconductor layer 154*d* of the second transistor (TRd) may be provided on the buffer layer 120. The semiconductor layers 154*p* and 154*d* include a channel region, and a source region and a drain region provided on respective sides of the channel region. The semiconductor layers 154*p* and 154*d* may include, for example, polysilicon, amorphous silicon, or an oxide semiconductor.

A first gate insulating layer 141 is provided on the buffer layer 120 and the semiconductor layers 154*p* and 154*d*. A first gate conductor including a gate electrode (also referred to as a control terminal or a control electrode) 124*p* of the first transistor (TRp) a gate electrode 124*d* of the second transistor (TRd), and a first electrode C1 of the storage capacitor Cst is provided on the first gate insulating layer 141. The first gate conductor may include a scan line 151 and/or an emission control line 153. The first gate conductor may be formed with a same material in a same process. For example, a conductive layer may be formed on the first gate insulating layer 141, and it may be patterned through a photolithography process to thus form a first gate conductor. The gate electrodes 124p and 124d may overlap the channel regions of the semiconductor layers 154p and 154d.

A second gate insulating layer 142 is provided on the first gate insulating layer 141 and the first gate conductor. A second gate conductor including a second electrode C2 of the storage capacitor Cst is provided on the second gate insulating layer 142. The first gate insulating layer 141 and the second gate insulating layer 142 may include an inorganic insulating material such as a silicon oxide (SiOx) or a silicon nitride (SiNx). The first and second gate conductors may be formed with molybdenum (Mo), but they are not limited thereto, and for example, they may be formed with a metal such as copper (Cu), aluminum (Al), silver (Ag), chromium (Cr), tantalum (Ta), titanium (Ti), or a metal alloy thereof.

A first inter-layer insulating layer 161 may be provided on the second gate insulating layer 142 and the second gate conductor. A source electrode (also referred to as a first electrode or an input terminal) 173d and a drain electrode 175d (also referred to as a second electrode or an output terminal) of the second transistor (TRd) are provided on the first inter-layer insulating layer 161. The source electrode 173d and the drain electrode 175d may be connected to the source region and the drain region of the semiconductor layer 154d through contact holes formed by penetrating through the first inter-layer insulating layer 161, the second gate insulating layer 142, and the first gate insulating layer 141. The source and drain electrodes 173d and 175d may be formed with a metal or a metal alloy having a melting point that is greater than about 700° C. to withstand being damaged during a high-temperature process for forming the sealant 50. For example, the source and drain electrodes 173d and 175d may be formed with a conductor having a high melting point such as molybdenum (Mo), aluminum-neodymium (AlNd), or titanium nitride (TiN). The source and drain electrodes 173d and 175d may be formed to be a single layer or multiple layers (Mo/Ti, TiN/AlNd, etc.).

A second inter-layer insulating layer 162 is provided on the first inter-layer insulating layer 161 and the source and drain electrodes 173d and 175d of the second transistor (TRd). The first inter-layer insulating layer 161 and second inter-layer insulating layer 162 may include an inorganic insulating material such as a silicon oxide (SiOx) or a silicon nitride (SiNx).

A data conductor including the source and drain electrodes 173p and 175p of the first transistor (TRp), a common voltage transmission line (CTL), and driving signal lines (DSLa) is provided on the second inter-layer insulating layer 162. The data conductor may include a data line 171 and/or a driving voltage line 172. The data conductor may be formed with a same material in a same process. The data conductor may be formed of aluminum (Al) with excellent conductivity and easy performance of dry etching. However, without being limited thereto, the data conductor may be exemplarily formed of a metal, such as copper (Cu), silver (Ag), molybdenum (Mo), chromium (Cr), gold (Au), platinum (Pt), palladium (Pd), tantalum (Ta), tungsten (W), titanium (Ti), or nickel (Ni), or metal alloy thereof. The data conductor may be formed to have multiple layers (Ti/Al/Ti, Mo/Al/Mo, Mo/Cu/Mo, etc.) or a single layer. The source electrode 173p and the drain electrode 175p may be connected to the source region and the drain region of the semiconductor layer 154p through the contact holes formed by penetrating through the second inter-layer insulating layer 162, the first inter-layer insulating layer 161, the second gate insulating layer 142, and the first gate insulating layer 141.

While two signal lines are shown in an embodiment as being the driving signal lines (DSLa), it should be understood that the driving signal lines (DSLa) may include a greater number of signal lines (e.g., signal lines corresponding to the number of signals applied to the driving circuit (DCa)) more than two. Differing from the driving circuit (DCa) provided in a circuit region (CR) overlapping the sealing region (SR), the driving signal line region (LR) in which the driving signal lines (DSLa) are provided may not overlap the sealing region (SR), and may be provided between the sealing region (SR) and the display area (DA). One of the driving signal lines (DSLa) may be connected to the source electrode 173d or the drain electrode 175d of the second transistor (TRd) through a contact hole formed in the second inter-layer insulating layer 162. The driving signal line (DSLa) connected to the source electrode 173d or the drain electrode 175d of the second transistor (TRd) may be a signal line for transmitting clock signals. In a plane view, a common voltage transmission line (CTL) is provided between the transistor (TRd) of the driving circuit (DCA) and the driving signal lines (DSLa). However, the source and drain electrodes 173d and 175d of the second transistor (TRd) may be provided on a different layer from that of the common voltage transmission line (CTL), so the source electrode 173d or the drain electrode 175d extends to a bottom portion of the driving signal line (DSLa) through the common voltage transmission line (CTL), and it may be connected to the driving signal line (DSLa).

A planarization layer 180 is provided on the second inter-layer insulating layer 162 and the data conductor. The planarization layer 180 may remove steps and may be provided to perform a planarization function that increases an emission efficiency of an organic light emitting element to be formed thereon. The planarization layer 180 may include an organic insulating material. The organic insulating material may include polyimide, polyamide, polyacrylate, polyphenylene ether, polyphenylene sulfide, unsaturated polyester, epoxy resin, or phenolic resin. The planarization layer 180 is not provided in the sealing region (SR) for reasons that include, for example, the heat generated in applying the sealant can damage the organic insulating material and cause the release of a gas that may damage a pixel.

A pixel electrode 191 and a connecting member 197 are provided on the planarization layer 180. The pixel electrode 191 and the connecting member 197 may be formed with a same material in a same process. For example, the pixel electrode 191 and the connecting member 197 may be formed by forming a conductive layer on the planarization layer 180 and patterning the same according to a photolithography process. The pixel electrode 191 may be connected to the drain electrode 175p, or the source electrode 173p, of the transistor through a contact hole formed in the planarization layer 180. The connecting member 197 is connected to the common voltage transmission line (CTL) not covered by the planarization layer 180. The pixel electrode 191 and the connecting member 197 may be formed of a reflective conductive material or a semi-transmissive conductive material, and it may be formed of a transparent conductive material.

A pixel defining layer 360 is provided on the planarization layer 180, and a protective member 360P is provided on the connecting member 197. The pixel defining layer 360 and the protective member 360P may be formed with a same material in a same process. The pixel defining layer 360 includes an opening overlapping the pixel electrode 191. The opening of the pixel defining layer 360 may limit a region corresponding to the pixel PX. The pixel defining layer 360 and the protective member 360P may include an organic insulating material such as polyimide, polyacrylate, or polyamide. The pixel defining layer 360 and the protective member 360P are not provided in the sealing region (SR)

An emission layer 370 is provided on the pixel electrode 191, and a common electrode 270 is provided on the emission layer 370. The common electrode 270 may include a transparent conductive material such as an indium-tin oxide (ITO) or an indium zinc oxide (IZO). The common electrode 270 is connected to the connecting member 197. The connecting member 197 is connected to the common voltage transmission line (CTL), so the common electrode 270 may be electrically connected to the common voltage transmission line (CTL) through the connecting member 197 and may receive a common voltage (ELVSS) from the common voltage transmission line (CTL). Differing from the shown exemplary embodiment, the display panel 10 may not include a connecting member 197, and the common electrode 270 may be connected to the common voltage transmission line (CTL). At least one capping layer or functional layer may be provided on the common electrode 270.

The pixel electrode 191 of each pixel PX, the emission layer 370, and the common electrode 270 configure a light-emitting element that comprises an organic light emitting diode (OLED). Here, the pixel electrode 191 may be an anode that is a hole injection electrode, and the common electrode 270 may be a cathode that is an electron injection electrode. On the contrary, the pixel electrode 191 may be a cathode, and the common electrode 270 may be an anode.

The second substrate 210 facing the first substrate 110 may be an insulation substrate comprised of glass, quartz, or ceramic. The second substrate 210 is bonded to the first substrate 110 by the sealant 50 provided in the sealing region (SR).

The second transistor (TRd) is provided in the circuit region (CR), and the circuit region (CR) overlaps the sealing region (SR) in which the sealant 50 is provided. Accordingly, a gap (W) between the sealing region (SR) and the display area (DA) may be further reduced compared to the case of when the circuit region (CR) does not overlap the sealing region (SR), thereby reducing the width of the non-display area (NDA). While the circuit region (CR) overlaps the sealing region (SR), the source and drain electrodes 173d and 175d that are the uppermost layers of the second transistor (TRd) that may be mostly influenced by the high-temperature process for forming the sealant 50 are formed of a conductor with a high melting point, such as molybdenum (Mo). Therefore, the second transistor (TRd) may not be damaged by the high-temperature process, and reliability of the second transistor (TRd) may be increased. In addition, signal delay may be minimized by forming the driving signal lines (DSLa) for transmitting driving circuit signals to the driving circuit (DCa) with a low-resistance conductor such as aluminum (Al). No organic insulating layer is provided in the sealing region (SR), so the risk caused by an organic insulating layer may be prevented in the high-temperature process. A cut marginal (CM) region provided outside the sealing region (SR) may be finally cut after the display panel 10 is manufactured.

FIG. 3 shows a cross-sectional view of a display panel 10 that has a slightly different structure from that of FIG. 2. Some of the differences between the exemplary embodiment of FIG. 3 and the exemplary embodiment of FIG. 2 will be described herein below.

Referring to FIG. 3, the second transistor (TRd) that is a transistor of the driving circuit (DCa) provided in the circuit region (CR) includes source and drain electrodes 173d and 175d provided between the second gate insulating layer 142 and the first inter-layer insulating layer 161. The source and drain electrodes 173d and 175d may be connected to a source region and a drain region of the semiconductor layer 154d through contact holes formed through the second gate insulating layer 142 and the first gate insulating layer 141.

Alternatively, the display panel 10 may not include the second inter-layer insulating layer 162 shown in FIG. 2, and a data conductor including source and drain electrodes 173p and 175p of the first transistor (TRp), a common voltage transmission line (CTL), and a driving signal lines (DSLa) may be provided on the first inter-layer insulating layer 161. Accordingly, the source electrode 173p and the drain electrode 175p may be connected to the source region and the drain region of the semiconductor layer 154p through contact holes formed through the first inter-layer insulating layer 161, the second gate insulating layer 142, and the first gate insulating layer 141. Further, one of the driving signal lines (DSLa) may be connected to the source electrode 173d or the drain electrode 175d of the second transistor (TRd) through a contact hole formed in the first inter-layer insulating layer 161. The source and drain electrodes 173d and 175d of the second transistor (TRd) and the second electrode C2 of the storage capacitor Cst may be formed with a same material in a same process.

Some of the differences according to other exemplary embodiments of the inventive concept from the above-described exemplary embodiments will now be described with reference to FIG. 4 to FIG. 8.

Figure 4:
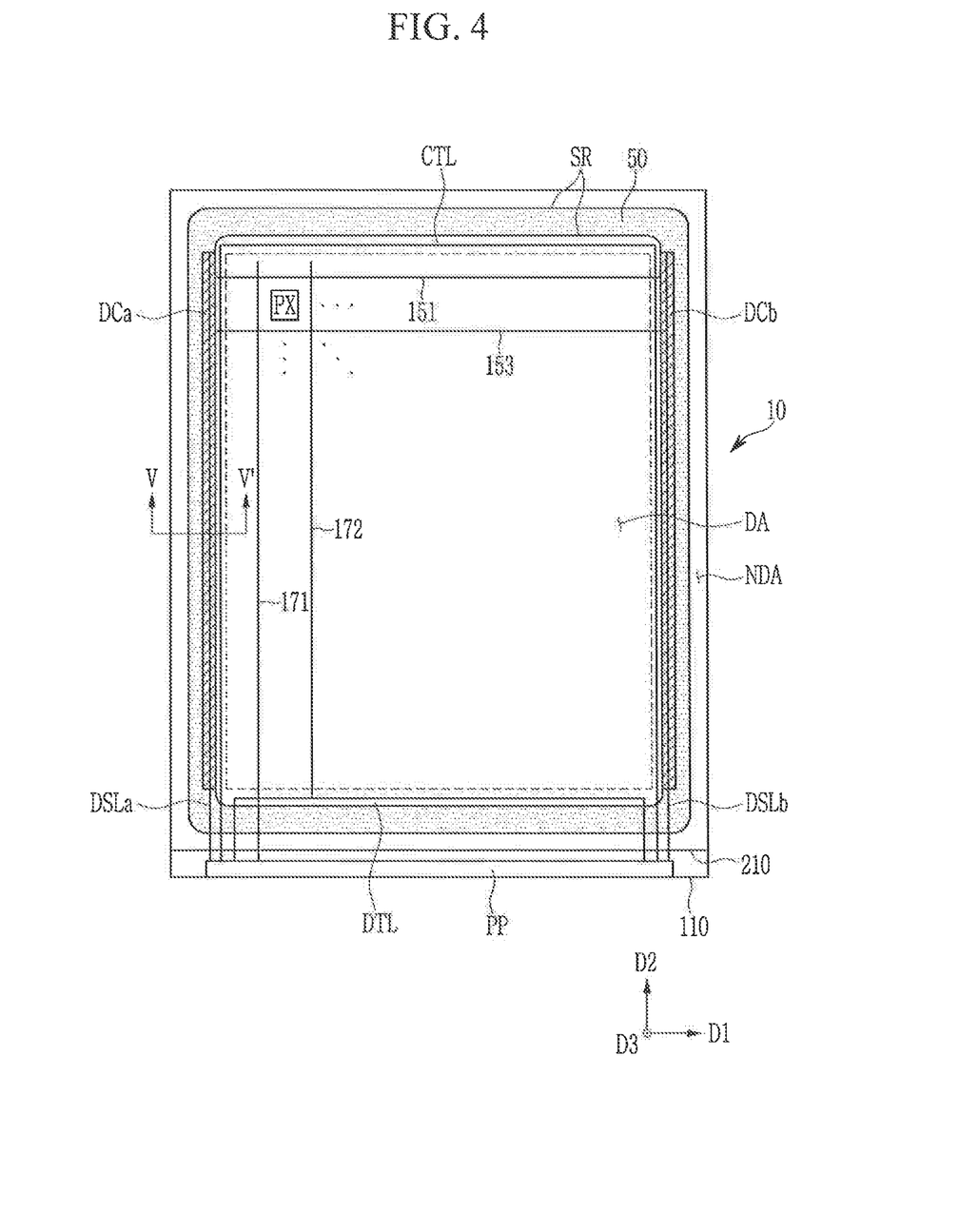
FIG. 4 shows a layout view of a display panel according to an exemplary embodiment of the inventive concept.
Figure 5:
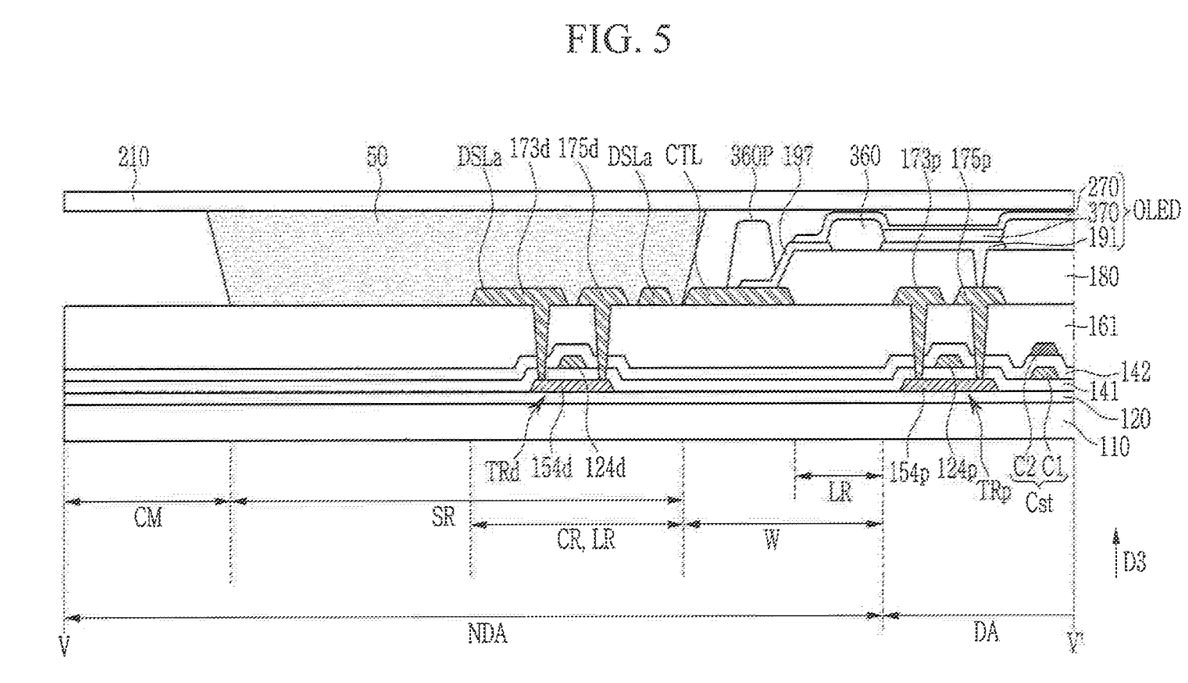
FIG. 5 shows a cross-sectional view of an example with respect to a line V-V' of FIG. 4.

FIG. 4 shows a layout view of a display panel according to an exemplary embodiment of the inventive concept, and FIG. 5 shows a cross-sectional view of an example with respect to a line V-V' of FIG. 4.

Referring to FIG. 4 and FIG. 5, the source and drain electrodes 173d and 175d of the second transistor (TRd), which is a transistor of the driving circuit (DCA), may be provided on the first inter-layer insulating layer 161 in a similar manner as the source and drain electrodes 173p and 175p of the first transistor (TRp), which is a transistor of the pixel PX. Therefore, the source and drain electrodes 173d and 175d of the second transistor (TRd) may be connected to the source region and the drain region of the semiconductor layer 154d through contact holes formed through the first inter-layer insulating layer 161, the second gate insulating layer 142, and the first gate insulating layer 141. Further, the driving signal lines (DSLa, DSLb) are not provided between the common voltage transmission line (CTL) and the display area (DA), and they are provided on the first inter-layer insulating layer 161 in the circuit region (CR) in which the driving circuit (DCa) is provided. Hence, the driving signal line (DSLa) may be connected to the source electrode 173d or the drain electrode 175d of the second transistor (TRd) on the first inter-layer insulating layer 161. As the driving signal lineregion (LR) is moved to overlap the sealing region (SR), a gap (W) between the sealing region (SR) and the display area (DA) may be reduced, and the width of the display area (NDA) may be reduced. Therefore, a width of the bezel of the display device may further be reduced.

The source and drain electrodes 173d and 175d of the second transistor (TRd), the driving signal lines (DSLa), the source and drain electrodes 173p and 175p of the first transistor (TRp), and the common voltage transmission line (CTL) may be formed with a same material in a same process. The source and drain electrodes 173d and 175d of the second transistor (TRd) overlapping the sealing region (SR) and an upper side of the driving signal lines (DSLa) may contact a lower side of the sealant 50. The source and drain electrodes 173d and 175d and the driving signal lines (DSLa) may be formed, for example, of a conductor that has a melting point that is equal to or greater than 700° C. and has excellent conductivity, for example, a material such as molybdenum (Mo), aluminum-neodymium (AlNd), or titanium nitride (TiN) so that they may not be damaged in a high-temperature process for forming the sealant 50. However, the source and drain electrodes 173d and 175d of the second transistor (TRd) and the driving signal lines (DSLa) may be formed with the conductor with a high melting point, and the source and drain electrodes 173p and 175p of the first transistor (TRp) and the common voltage transmission line (CTL) may be formed with a low-resistance conductor such as aluminum.

Figure 6:
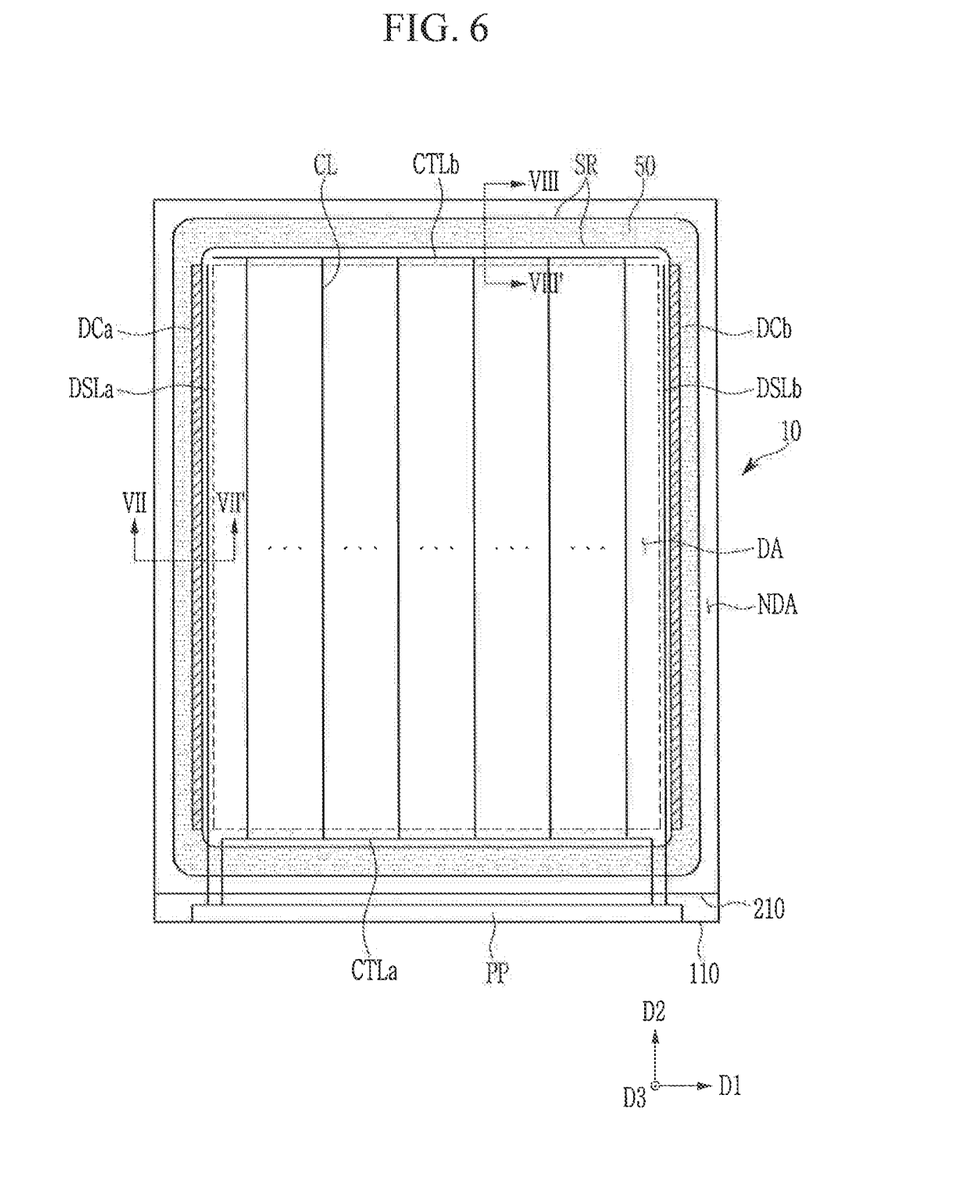
FIG. 6 shows a layout view of a display panel according to an exemplary embodiment of the inventive concept.
Figure 7:
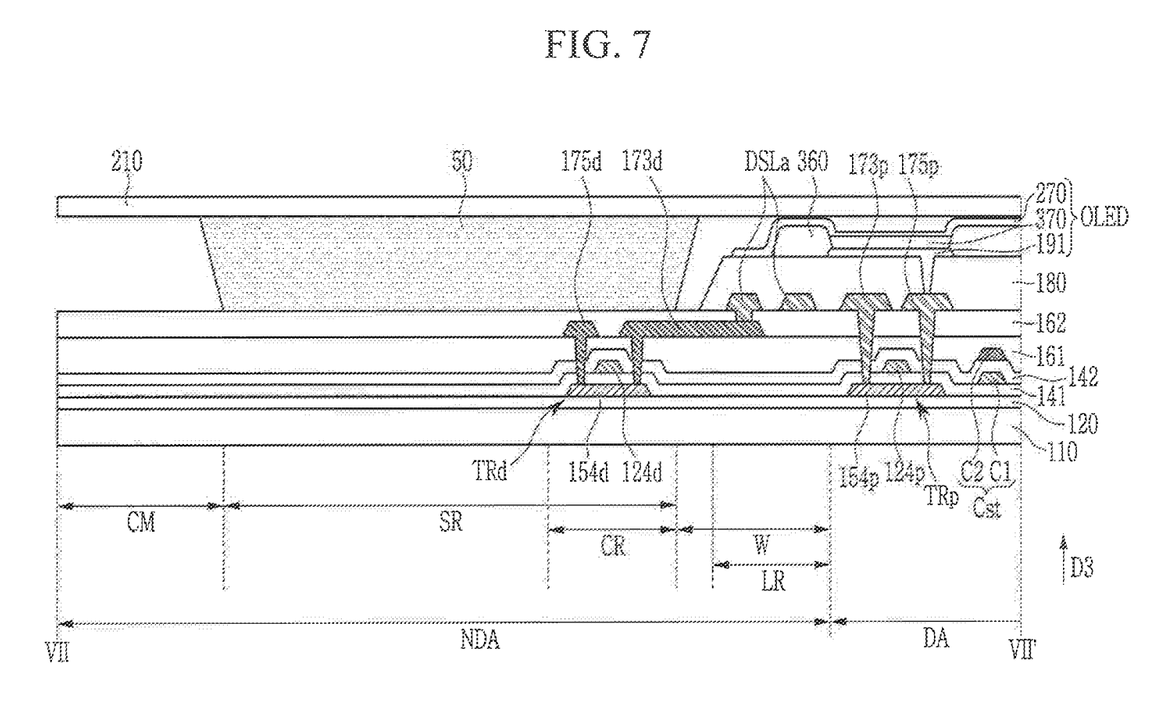
FIG. 7 shows a cross-sectional view of an example with respect to a line VII-VII' of FIG. 6.
Figure 8:
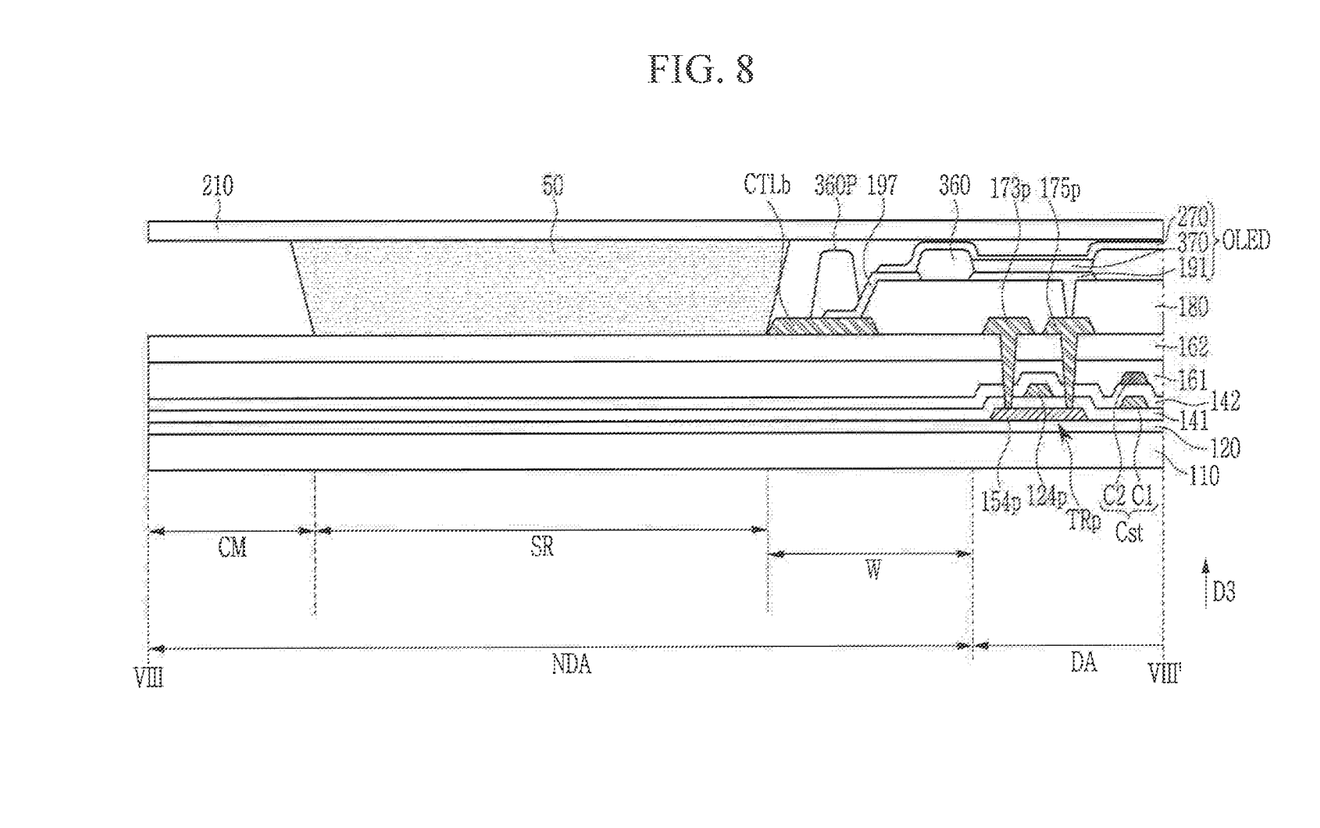
FIG. 8 shows a cross-sectional view of an example with respect to a line VIII-VII' of FIG. 6.

FIG. 6 shows a layout view of a display panel according to an exemplary embodiment of the inventive concept, FIG. 7 shows a cross-sectional view of an example with respect to a line VII-VII' of FIG. 6, and FIG. 8 shows a cross-sectional view of an example with respect to a line VIII-VIII' of FIG. 6. To avoid obscuring of the drawing with repetitive detail, the scan line 151, the emission control line 153, the driving voltage line 172, and the driving voltage transmission line (DTL) shown in FIG. 1 are not shown in FIG. 6.

Referring now to FIG. 6, FIG. 7, and FIG. 8, a person of ordinary skill in the art can understand and appreciate that the common voltage transmission lines (CTLa, CTLb) are not provided in the right and left sides of the display area (DA), and instead in this embodiment are provided in the lower and upper sides thereof. In other words, the common voltage transmission lines (CrLa, CTLb) include a common voltage transmission line (CTLa) provided on a lower side of the display area (DA) and a common voltage transmission line (CTLb) provided on an upper side of the display area (DA). The common voltage transmission line (CTLa) is electrically connected to the pad portion (PP), and the common voltage transmission line (CTLb) is connected to the lower-side common voltage transmission line (CTLa) through connection lines CL traversing the display area (DA). The common electrode 270 of the pixel PX may be, as shown in FIG. 8, connected to the common voltage transmission line (CTLb) from the upper side of the display area (DA) through the connecting member 197. Although not shown, the common electrode 270 of the pixel PX may be connected to the common voltage transmission line (CTLa) from the lower side of the display area (DA) through the connecting member 197. The common voltage transmission lines (CTLa, CTLb) and/or the connection lines CL may be formed of a same material as the source and drain electrodes 173p and 175p of the first transistor (TRp) in a similar process.

The common voltage transmission lines (CTLa, CTLb) by having the connections as discussed above along a lower side and an upper side of the display area (DA), as, opposed, for example to being provided on the right and left sides of the display area (DA). By not providing the common voltage transmission lines (CTLa, CTLb) on the right and left sides of the display area (DA), the gap (W) (FIG. 7) between the sealing region (SR) and the display area (DA) may be reduced and the width of the display area (NDA) may be reduced. Therefore, the width of the bezel of the display device may be further reduced. A structure of the second transistor (TRd) provided in the circuit region (CR) may correspond to an exemplary embodiment described with reference to FIG. 2. One of the driving signal lines (DSLa, DSLb) may be connected to the source electrode 173d or the drain electrode 175d of the second transistor (TRd) through a contact hole formed in the second inter-layer insulating layer 162.

A display device according to an exemplary embodiment of the inventive concept will now be described with a focus on a pixel of a display area (DA) with reference to FIG. 9. FIG. 1 will also be referred to discuss a relationship with other constituent elements of the display device.

Figure 9:
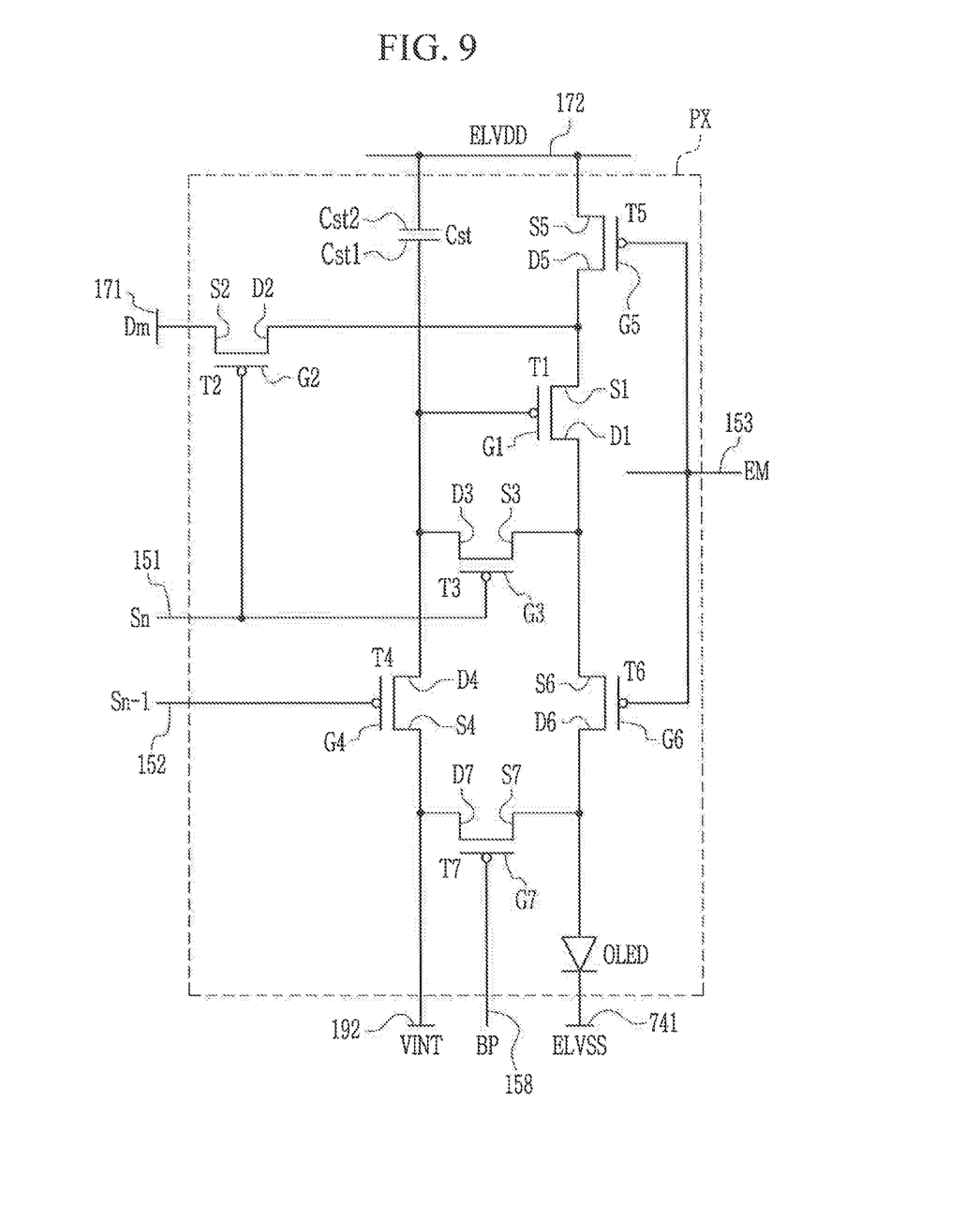
FIG. 9 shows an equivalent circuit diagram of a pixel of a display device according to an exemplary embodiment of the inventive concept.

FIG. 9 shows an equivalent circuit diagram of a pixel of a display device according to an exemplary embodiment of the inventive concept.

Referring to FIG. 8 and FIG. 9, the pixel PX provided in the display area (DA) includes transistors (TI-T7) connected to display signal lines (151, 152, 153, 158, 171, 172, and 192), a storage capacitor Cst, and an organic light emitting diode (OLED).

The transistors (T1-T7) may include, for example, a driving transistor T1, a switching transistor T2, a compensation transistor T3, an initialization transistor T4, an operation control transistor T5, an emission control transistor T6, and a bypass transistor T7.

The display signal lines (151, 152, 153, 158, 171, 172, and 192) may include a scan line 151, a previous-stages scan line 152, an emission control line 153, a bypass control line 158, a data line 171, a driving voltage line 172, and an initialization voltage line 192. The scan line 151 and the previous-stages scan line 152 may be connected to a scan driver of the above-noted driving circuits (DCA, DCb) to receive a scan signal (Sn) and a previous-stage scan signal Sn−1, and the emission control line 153 may be connected to an emission driver of the driving circuits (DCA, DCb) to receive an emission control signal (EM).

The previous-stages scan line 152 transmits a previous-stage scan signal Sn−1 to the initialization transistor T4, the emission control line 153 transmits an emission control signal (EM) to the operation control transistor T5 and the emission control transistor T6, and the bypass control line 158 transmits a bypass signal (BP) to the bypass transistor T7.

The data line 171 may receive a data signal (Dm), the driving voltage line 172 may receive a driving voltage (ELVDD), and the initialization voltage line 192 may receive an initialization voltage (VINT). The initialization voltage (VINT) initializes the driving transistor T1.

The driving transistor T1 may include a gate electrode G1 connected to a first end Cst1 (which corresponds to the first electrode C1 of FIG. 2) of the storage capacitor Cat. The driving transistor T1 may include a source electrode S1 connected to a driving voltage line 172 through the operation control transistor T5. The driving transistor T1 may include a drain electrode D1 connected to an anode of the organic light emitting diode (OLED) through the emission control transistor T6.

The switching transistor T2 may include a gate electrode G2 connected to the scan line 151. The switching transistor T2 may include a source electrode S2 connected to the data line 171. The switching transistor T2 may include a drain electrode D2 connected to the source electrode S1 of the driving transistor T1 and connected to the driving voltage line 172 through the operation control transistor T5.

The compensation transistor T3 may include a gate electrode G3 connected to the scan line 151. The compensation transistor T3 may include a source electrode S3 connected to the drain electrode D1 of the driving transistor T1 and connected to the anode of the organic light emitting diode (OLED) through the emission control transistor T6. The compensation transistor T3 may include a drain electrode D3 connected to the drain electrode D4 of the initialization transistor T4, the first end Cst1 of the storage capacitor Cst, and the gate electrode G1 of the driving transistor T1.

The initialization transistor T4 may include a gate electrode G4 connected to the previous-stages scan line 152. The initialization transistor T4 may include a source electrode S4 connected to the initialization voltage line 192. The initialization transistor T4 may include a drain electrode D4 connected to the first end Cst1 of the storage capacitor Cst and the gate electrode G1 of the driving transistor T1 through the drain electrode D3 of the compensation transistor T3.

The operation control transistor T5 may include a gate electrode G5 connected to the emission control line 153. The operation control transistor T5 may include a source electrode S5 connected to the driving voltage line 172. The operation control transistor T5 may include a drain electrode D5 connected to the source electrode S1 of the driving transistor T1 and the drain electrode D2 of the switching transistor T2.

The emission control transistor T6 may include a gate electrode G6 connected to the emission control line 153. The emission control transistor T6 may include a source electrode S6 connected to the drain electrode D1 of the driving transistor T1 and the source electrode S3 of the compensation transistor T3. The emission control transistor T6 may include a drain electrode D6 connected to the anode of the organic light emitting diode (OLED).

The bypass transistor T7 may include a gate electrode G7 connected to the bypass control line 158. The bypass transistor 17 may include a source electrode S7 connected to the drain electrode D6 of the emission control transistor T6 and the anode of the organic light emitting diode (OLED). The bypass transistor T7 may include a drain electrode D7 connected to the initialization voltage line 192 and the source electrode S4 of the initialization transistor T4.

The storage capacitor Cst includes a first end Cst1 and a second end (Cst2). The second end Cst2, which corresponds to the second electrode C2 shown in FIG. 2, may be connected to the driving voltage line 172. The organic light emitting diode (OLED) includes a cathode connected to a common voltage transmission line (741) (which corresponds to the common voltage transmission line (CTL) of FIG. 2) for transmitting a common voltage (ELVSS). The common voltage transmission line 741 or the cathode receives the common voltage (ELVSS).

A person of ordinary skill in the art should understand and appreciate that the circuit structure of the pixel PX is not limited to the structure shown in FIG. 9, and the number of transistors and capacitors and connections between them are modifiable in various ways. For example, the transistors (T1-T7) used in one embodiment may be p-channel, and in another embodiment n-channel transistors may be used.

While embodiments of the inventive concept have been described herein, it is to be understood that the appended claims are not limited to the disclosed embodiments, but, on the contrary, are intended to cover various modifications and equivalent arrangements.

What is claimed is:
1. A display device comprising:
a first substrate including a display area and a non-display area;
a first transistor disposed in the display area, and the first transistor comprises a semiconductor layer, a gate electrode, a source electrode, and a drain electrode;
a driving circuit disposed in the non-display area, and the driving circuit includes a second transistor that comprises a semiconductor layer, a gate electrode, a source electrode, and a drain electrode;
a first insulating layer disposed between the source and drain electrodes of the second, transistor and the source and drain electrodes of the first transistor and on the second transistor;
a signal transmission line disposed in the non-display area that transmits a signal to the driving circuit;
a second substrate facing the first substrate; and
a sealant disposed in the non-display area between the first substrate and the second substrate, and overlapping the second transistor, wherein the first insulating layer is disposed between the source electrode and the drain electrode of the second transistor and the sealant to overlap the source electrode and the drain electrode of the second transistor.

2. The display device of claim 1, wherein the non-display area is arranged along at least portion of a periphery of the display area, and the driving circuit includes a first driving circuit and a second driving circuit arranged at least at one of a left side or a right side of the non-display area, and wherein the sealant overlaps the first driving circuit and the second driving circuit.

3. The display device of claim 1, wherein the signal transmission line is connected to the second transistor through a contact hole formed in the first insulating layer.

4. The display device of claim 3, wherein the source electrode and, the drain electrode of the first transistor are connected to the semiconductor layer of the first transistor through a plurality of contact holes formed in the first insulating layer.

5. The display device of claim 3, further comprising a common voltage transmission line disposed between the second transistor and the signal transmission line in the non-display area,
wherein the common voltage transmission line is disposed to overlap the source electrode or the drain electrode of the second transistor.

6. The display device of claim 1, further comprising a plurality of second insulating layers disposed between the gate electrode of the second transistor and the source and drain electrodes of the second transistor.

7. The display device of claim 1, wherein the source electrode and the drain electrode of the second transistor are comprised of a metal with a melting point that is equal to or greater than 700° C., or a metal alloy thereof.

8. The display device of claim 7, wherein the metal is molybdenum, and the metal alloy is aluminum-neodymium or a titanium nitride.

9. The display device of claim 1, further comprising a common voltage transmission line disposed between the sealant and the display area,
wherein the common voltage transmission line includes a first common voltage transmission line and a second common voltage transmission line facing each other with the display area therebetween, and the first common voltage transmission line is electrically connected to the second common voltage transmission line by a plurality of connection lines traversing the display area.

10. The display device of claim 9, wherein a light-emitting dement disposed in the display area includes a pixel electrode, a common electrode, and an emission layer between the pixel electrode and the common electrode, and the common electrode is electrically connected to the common voltage transmission line.

11. The display device of claim 1, wherein the first insulating layer is a non-organic insulating layer.

12. A display device comprising:
a first substrate including a display area and a non-display area;
a light-emitting element disposed in the display area, and including a pixel electrode, a common electrode, and an emission layer;
a driving circuit provided in the non-display area, and generating and outputting a driving signal for the light-emitting element;
a second substrate facing the first substrate;
a sealant disposed in the non-display area between the first substrate and the second substrate, and overlapping at least part of the driving circuit; and
a common voltage transmission line electrically connected to the common electrode, disposed between the sealant and the display area, and wherein the common voltage transmission line is not disposed between the driving circuit and the light emitting element of the display area.

13. The display device of claim 12, wherein
the common voltage transmission line includes a first common voltage transmission line and a second common voltage transmission line facing each other with the display area therebetween, and
the first common voltage transmission line is electrically connected to the second common voltage transmission line by a plurality of connection lines traversing the display area.

14. The display device of claim 13, wherein the driving circuit includes a first driving circuit and a second driving circuit facing, each other with the display area therebetween in a direction different from a direction in which the first common voltage transmission line faces the second common voltage transmission line.

15. The display device of claim 12, wherein
the driving circuit, includes a transistor overlapping the sealant, and
a source electrode and a drain electrode of the transistor are formed of a metal with a melting point equal to or greater than 700° C., or a metal alloy thereof.

16. The display device of claim 15, wherein the metal is molybdenum, and the metal alloy is aluminum-neodymium or a titanium nitride.

17. The display device, of claim 15, further comprising
a signal transmission line for transmitting a signal to the driving circuit,
wherein the signal transmission line is formed of a same material as the source electrode and the drain electrode of the transistor.

18. The display device of claim 17, wherein the sealant overlaps signal transmission line.

* * * * *